United States Patent
Ferrant et al.

(10) Patent No.: US 6,360,294 B1
(45) Date of Patent: Mar. 19, 2002

(54) DEVICE AND METHOD FOR SIMULTANEOUSLY READING/REWRITING A DYNAMIC RANDOM-ACCESS MEMORY CELL USING A PLURALITY OF AMPLIFIERS AND ISOLATION CIRCUITRY

(75) Inventors: Richard Ferrant, St. Ismier; Michel Bouche, Murianette le Bourg, both of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/231,423

(22) Filed: Jan. 14, 1999

(30) Foreign Application Priority Data

Jan. 15, 1998 (FR) .............................. 98 00372

(51) Int. Cl.⁷ .............................................. G06F 21/00
(52) U.S. Cl. ...................... 711/105; 711/106; 365/205; 365/222; 365/189.04
(58) Field of Search ................................ 711/104, 105, 711/106; 365/222, 205, 207, 208, 189.04

(56) References Cited

U.S. PATENT DOCUMENTS

| | | | |
|---|---|---|---|
| 3,949,383 A | 4/1976 | Askin et al. ................ 365/203 |
| 4,829,484 A | 5/1989 | Arimioto et al. ........... 365/222 |
| 4,980,863 A | 12/1990 | Ogihara ...................... 365/205 |
| 5,253,211 A * | 10/1993 | Suzuki ........................ 365/222 |
| 5,291,443 A * | 3/1994 | Lim ....................... 365/189.04 |
| 5,587,952 A * | 12/1996 | Kitsukawa et al. ......... 365/207 |
| 5,644,543 A * | 7/1997 | Kim et al. .................. 365/207 |
| 5,822,266 A * | 10/1998 | Kikinis ....................... 365/222 |

FOREIGN PATENT DOCUMENTS

EP 0 828 254 A2 3/1998

\* cited by examiner

*Primary Examiner*—Glenn Gossage
(74) *Attorney, Agent, or Firm*—Lisa K. Jorgenson; Allen, Dyer, Doppelt, Milbrath & Gilchrist, P.A.

(57) ABSTRACT

A device for reading/rewriting a memory cell of a dynamic random-access memory organized in rows and columns, comprises, for each column, a first read/rewrite amplifier, and at least one second read/rewrite amplifier arranged in parallel with the first amplifier. A controller is provided for one of the amplifiers so that the amplifier is able to store the information contained in the memory cell for refreshing thereof, and so that the other amplifier is able to simultaneously perform read/rewrite accesses to and from the memory cell. One of the amplifiers may be permanently dedicated to operations for refreshing the memory cells and the other may be dedicated to read/write operations. Outputs of the amplifiers are connected to common output columns, and the controller includes an interrupter for the output of each amplifier to isolate the output from the corresponding output column and from the corresponding output of the other amplifier.

22 Claims, 3 Drawing Sheets

DEVICE AND METHOD FOR SIMULTANEOUSLY READING/REWRITING A DYNAMIC RANDOM-ACCESS MEMORY CELL USING A PLURALITY OF AMPLIFIERS AND ISOLATION CIRCUITRY

FIELD OF THE INVENTION

The invention relates to memories, and, more particularly to a device and process for reading/rewriting of a memory cell or memory slot of a dynamic random-access memory (DRAM), but not exclusively with respect to a memory cell or memory slot with one, two or three transistors.

BACKGROUND OF THE INVENTION

As opposed to static random access memories (SRAMs) in which the information stored remains so indefinitely at least for as long as this memory remains energized, dynamic memories exhibit the feature of requiring a periodic refreshing of the information stored. This so because of the stray leakage currents which discharge the storage capacitance of each memory slot.

Dynamic random access memories are conventionally organized in rows and columns of memory cells and comprise, for each column, an amplification device for reading/rewriting each memory cell selected. This device comprises precharge means making it possible to precharge the corresponding column of the matrix (commonly termed a "Bit Line" by those of ordinary skill in the art) to a chosen voltage level. The device also includes amplification means comprising two looped-back inverters forming a bistable flip-flop each formed by two complementary transistors and controlled by two successive signals, read and rewrite (commonly known respectively as "sense" and "restore").

The periodic refreshing of the information stored is performed memory cell after memory cell within a given line, and line after line. Over the duration of refreshing a line, no memory cell of this line can be the subject of read or write access, since the amplifier still contains the information from the memory cell addressed and therefore may not be used at the same time to refresh other lines. Thus, the application which uses the dynamic random-access memory must be halted periodically so as to carry out the refreshing of the memory cells. This causes a slowing down of the execution of the application and a degradation of the performance of the apparatus in which the dynamic random-access memory is arranged.

SUMMARY OF THE INVENTION

The invention overcomes this problem by enabling the application to operate during the refreshing of the information contained in a memory cell.

An object of the invention is to improve the speed of reading and writing perceived by the user of the dynamic random-access memory and to allow read/rewrite accesses simultaneously with the refresh operations.

The device for reading/rewriting a memory cell of a dynamic random-access memory organized in rows and columns, according to the invention, comprises, for each column, a first read/rewrite amplifier. The device comprises at least one second read/rewrite amplifier connected in parallel with the first amplifier and means for controlling one of the amplifiers so that the amplifier is able to store the information contained in the memory cell so that the memory cell may be refreshed and so that the other amplifier is able to perform read/rewrite accesses to the memory cell.

Thus, during a refresh operation, the information remains available in one of the amplifiers and is available for a read access. This same amplifier is available during this time for a write access.

In one embodiment of the invention, with the inputs of the amplifiers being connected to two common columns, one of which is connected to the memory cell, each input of each amplifier is provided with control means able to isolate the input from the corresponding column and from the input of the other amplifier. The device can comprise a pre-amplifier arranged between the memory cell and the amplifiers. This pre-amplifier makes it possible to speed up the operation of the memory.

In one embodiment of the invention, one of the amplifiers is permanently dedicated to operations for refreshing the memory cell and the other amplifier is dedicated to the memory cell read/rewrite operations. In another embodiment of the invention, each amplifier is able alternately to perform the refresh operations and the read/rewrite operations.

Advantageously, the outputs of the amplifiers are connected to common output columns, each output of each amplifier being provided with an interrupter able to isolate the output from the corresponding output column and from the corresponding output of the other amplifier. The roles of the two amplifiers are thus interchangeable. The device can comprise an amplifier arranged at each end of a column. This arrangement is advantageous since it allows the presence of two amplifiers in a dynamic random-access memory possessing a small number of levels of metallization by virtue of smaller bulk.

The invention also proposes a process for controlling a device for reading/rewriting a memory cell of a dynamic random-access memory organized in rows and columns.

The device includes, for each column, at least two read/rewrite amplifiers arranged in parallel. During a write operation of a memory cell, one of the amplifiers holds a new datum which is to be written to the memory cell and the other amplifier performs operations for refreshing the memory cell. The new datum is written to the memory cell at the conclusion of the access to the line to which the memory cell belongs so as not to interrupt any refresh operation e being performed on the line. The datum stored in the memory cell can be held in one of the amplifiers prior to a read operation, so that the datum can be available for a refresh operation.

Thus, the application currently operating and perhaps requiring use of the information stored in the dynamic random-access memory is not halted during the operations for refreshing the memory cells. Therefore, from the point of view of the user of the dynamic random-access memory, this increases the speed of reading/rewriting and allows an improvement in the processing speed of the application.

BRIEF DESCRIPTION OF THE DRAWINGS

The present invention will be better understood on reading the detailed description of an embodiment taken by way of an entirely non-limiting example and illustrated in the appended drawings, in which.

DETAILED DESCRIPTION OF THE PREFERRED EMBODIMENTS

Figure 1:
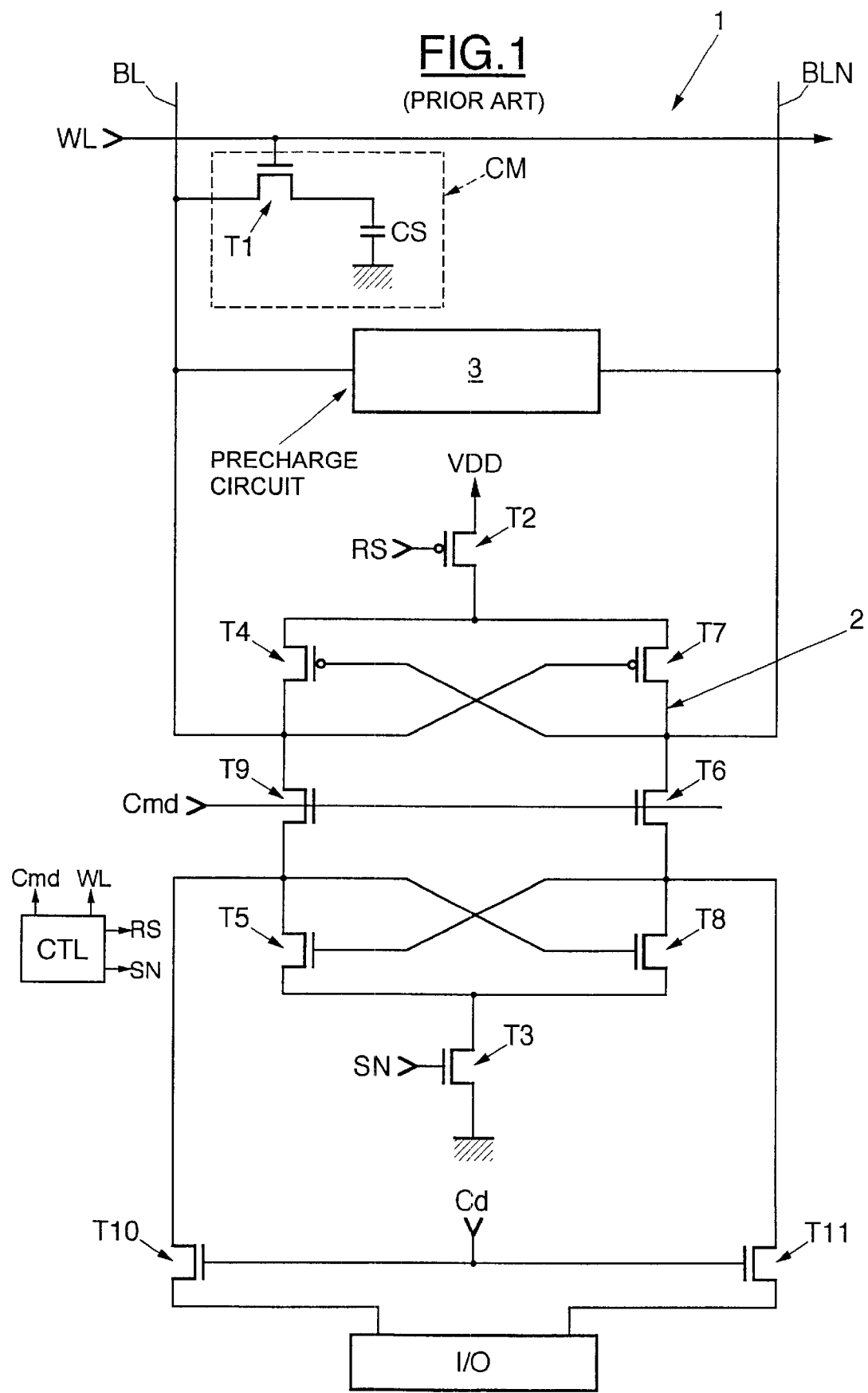
FIG. 1 diagrammatically illustrates the structure of a read/rewrite device according to the prior art.

For the sake of simplification, FIG. 1 represents only a single memory cell CM comprising a storage capacitance CS and a single transistor T1. Of course, these memory cells CM are organized in rows and columns. More precisely, in the case illustrated in FIG. 1, all the memory cells CM connected to a respective column metallization BL, i.e., a bit line, are selected by a corresponding word line WL. The metallization of the adjacent column BLN makes it possible to connect in a quincunx fashion (i.e., an arrangement of five items in a square or rectangle with one item at each corner and one in the middle) other rows of memory cells CM which can be selected respectively by the same word line WL signal. Conventionally, the two columns BL and BLN are connected to input/output (I/O) means I/O by two NMOS transistors T10 and T11 controlled by a control signal Cd.

In the example described here, the device 1 comprises amplification means 2 comprising two inverters each formed by two complementary insulated-gate field-effect transistors, T4 and T7 and T5 and T8. The sources of the two transistors T4 and T7 are connected to the bias voltage VDD of high level via a transistor T2 controlled by a rewrite signal ("restore") RS. The sources of the two transistors T5 and T8 are connected to ground via a transistor T3 controlled on its gate by a read signal ("sense") SN.

A decoupling structure is connected between the transistors T4 and T7 and the transistors T5 and T8 and is formed by a pair of transistors T6 and T9. The gates of the two transistors T6 and T9 are controlled by a control signal Cmd. Monitoring means CTL, of conventional construction comprising in particular logic gates, deliver signals WL, RS, SN and Cmd. Moreover, the device comprises precharge means 3, constructed in a manner known per se, making it possible to precharge the metallizations of columns BL and BLN to a chosen precharge level, for example VDD/2.

Figure 2:
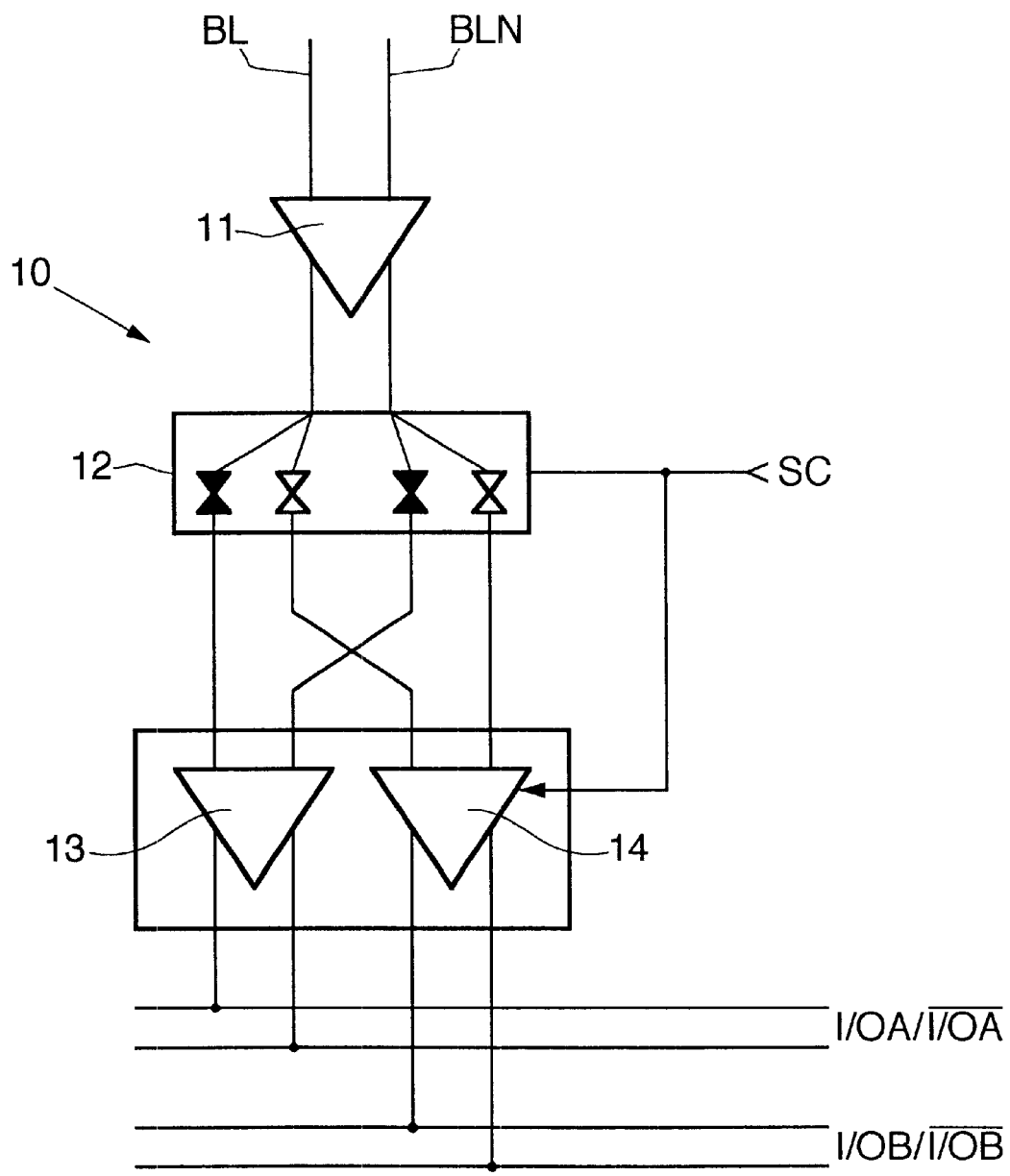
FIG. 2 is a diagrammatic view of the read/rewrite device in accordance with the invention.

As may be seen in FIG. 2, the read/rewrite device 10 of the invention comprises a pre-amplifier 11 of low gain, making it possible to increase the voltage offset existing between the lines and thus to increase the length of the bit lines. The output of the pre-amplifier 11 is connected to control means 12 having outputs which are connected to two amplifiers 13 and 14 arranged in parallel and whose outputs are connected to input and output lines I/OA and I/OB. Each amplifier 11, 13 and 14 can, for example, be of the type illustrated in FIG. 1.

The control means 12 places a first output of the pre-amplifier 11 in communication with a first input of the amplifier 13 by isolating it from the first input of the amplifier 14 and vice versa. The control means 12 also places the second output of the pre-amplifier 11 in communication with a second input of the amplifier 13 by isolating it from the second input of the amplifier 14 and vice versa.

Figure 3:
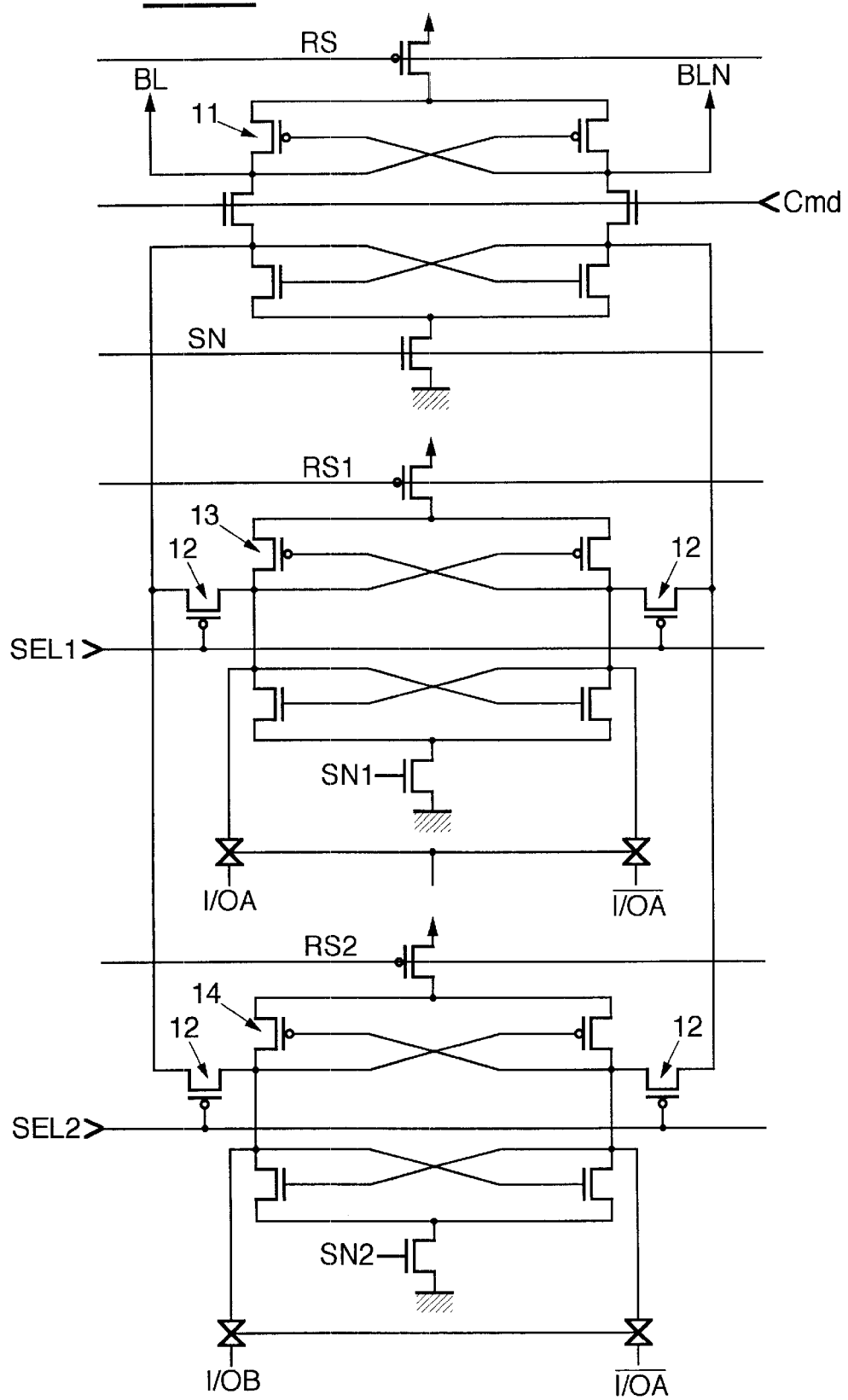
FIG. 3 is a more detailed view of the read/write device illustrated in FIG. 2.

As may be seen in FIG. 3, the control means 12 comprise two pairs of transistors, one assigned to the amplifier 13 and the other assigned to the amplifier 14, which are controlled respectively by the signals SEL1 and SEL2. This makes it possible to isolate one of the amplifiers 13 or 14, while the other is connected to the pre-amplifier 11.

During an operation for refreshing the memory cell CM, the amplifier 13 can remain available for this operation, and with the interrupters e.g., transistors of the control means 12 associated with the amplifier 13 remaining on. The amplifier 14 stores the information contained in the memory cell CM and is isolated from the remainder of the control means 12. The transistors of the control means 12, which are associated with the amplifier 14, are off. The refresh operation can therefore be performed in the conventional manner by using the amplifier 13 and the pre-amplifier 11. During this operation, the information contained in the memory cell CM is available in the amplifier 14 in read mode.

Likewise, the amplifier 14 can be used for an operation for writing a datum during an operation for refreshing the memory cell CM. The new datum is stored in the amplifier 14 until the conclusion of the refresh operation. The transistors of the control means 12, which are associated with the amplifier 14, are then controlled by the signal SEL2 and take an "on" state which allows the new datum stored in the amplifier 14 to be transferred to the pre-amplifier 11 and the memory cell CM. The amplifier 14 is powerful enough to expunge the information contained in the pre-amplifier 11. The writing of the memory cell CM is thus postponed to the conclusion of the refresh operation. By considering the read/rewrite device as a whole, the refresh and read/rewrite access operations can be performed simultaneously.

By way of an alternate embodiment, it is also possible to provide control means, not shown, arranged at the output of the amplifiers 13 and 14. These control means may be of a type analogous to the control means 12. These control means can make it possible to use the amplifiers 13 and 14 in an entirely interchangeable manner, with each of these two amplifiers 13 and 14 being able to serve equally well for the refresh operations and for the read and write operations. This embodiment makes it possible, during a refresh, to store the data of a line n of memory cells in the amplifiers 13 and the data of line n+1 in the amplifiers 14 and so on and so forth. This eliminates the usual latency of 3 to 4 clock pulses upon a change of row, with the latency being due to the electric charges which have to travel through the input/output lines.

By virtue of the invention, a user-transparent read/rewrite process and device are available, affording the user a considerable gain in operating speed. This device can be installed in a dynamic random-access memory built into a microprocessor and can also be installed in a standard dynamic random-access memory.

That which is claimed is:

1. A device for reading/rewriting a memory cell of a dynamic random-access memory organized in rows and columns, comprising:

a first read/rewrite amplifier having inputs for each column and outputs for a first pair of input/output lines;

a second read/rewrite amplifier having inputs for each column and outputs for a second pair of input/output lines; and control means for controlling the first amplifier for a given column for storing information contained in the memory cell for refreshing thereof and for controlling the second amplifier for the given column for performing read/rewrite operations to the memory cell, said control means comprising an interrupter for isolating at least one of the inputs and outputs of each amplifier.

2. A device according to claim 1, further comprising a pre-amplifier connected between the memory cell and the amplifiers.

3. A device according to claim 1, wherein one of the two amplifiers of each column is permanently dedicated to operations for refreshing the memory cell and the other amplifier of each column is dedicated to memory cell read/rewrite operations.

4. A device according to claim 1, wherein the inputs of the two amplifiers are connected to two common columns, one of which is connected to the memory cell.

5. A device according to claim 4, wherein said interrupter comprises at least one transistor for each amplifier for isolating the inputs thereof from the corresponding column and from the inputs of the other amplifier connected to the same corresponding column.

6. A device according to claim 1, wherein each amplifier is able to alternately perform refresh operations and read/rewrite operations.

7. A device according to claim 6, wherein said interrupter comprises at least one transistor for each amplifier for isolating the outputs thereof from the corresponding column and from the outputs of the other amplifier connected to the same corresponding column.

8. A dynamic random-access memory (DRAM) comprising:
   a plurality of memory cells organized in rows and columns; and
   a reading/rewriting device for a memory cell of the plurality of memory cells, the reading/rewriting device comprising
      a first read/rewrite amplifier having inputs for each column and outputs for a first pair of input/output lines,
      a second read/rewrite amplifier having inputs for each column and outputs for a second pair of input/output lines, and
      a control circuit for controlling the first amplifier for a given column for storing information contained in the memory cell for refreshing thereof and for controlling the second amplifier for the given column for performing read/rewrite operations to the memory cell, said control circuit comprising an interrupter for isolating at least one of the inputs and outputs of each amplifier.

9. A DRAM according to claim 8, further comprising a pre-amplifier connected between the memory cell and the amplifiers.

10. A DRAM according to claim 8, wherein one of the two amplifiers of each column is permanently dedicated to operations for refreshing the memory cell and the other amplifier is dedicated to memory cell read/rewrite operations.

11. A DRAM according to claim 8, wherein the inputs of the two amplifiers are connected to two common columns, one of which is connected to the memory cell.

12. A DRAM according to claim 11, wherein said interrupter comprises at least one transistor for each amplifier for isolating the inputs thereof from the corresponding column and from the inputs of the other amplifier connected to the same corresponding column.

13. A DRAM according to claim 8, wherein each amplifier is able to alternately perform refresh operations and read/write operations.

14. A DRAM according to claim 13, wherein said interrupter comprises at least one transistor for each amplifier for isolating the outputs thereof from the corresponding column and from the outputs of the other amplifier connected to the same corresponding column.

15. A dynamic random-access memory (DRAM) comprising:
   a plurality of memory cells organized in rows and columns; and
   a reading/rewriting device for a memory cell of the plurality of memory cells, the reading/rewriting device comprising
      a first read/rewrite amplifier having inputs for each column and outputs for a first pair of input/output lines,
      a second read/rewrite amplifier having inputs for each column and outputs for a second pair of input/output lines,
      the inputs of the two amplifiers being connected to two common columns, one of which is connected to the memory cell, and
      a control circuit for controlling the first amplifier for a given column for storing information contained in the memory cell for refreshing thereof and for controlling the second amplifier for the given column for performing read/rewrite operations to the memory cell, said control circuit comprising an interrupter for isolating at least one of the inputs and outputs of each amplifier.

16. A DRAM according to claim 15, wherein said interrupter comprises at least one transistor for each amplifier for isolating the inputs thereof from the corresponding column and from the inputs of the other amplifier connected to the same corresponding column.

17. A DRAM according to claim 15, further comprising a pre-amplifier connected between the memory cell and the amplifiers.

18. A DRAM according to claim 15, wherein one of the two amplifiers of each column is permanently dedicated to operations for refreshing the memory cell and the other amplifier is dedicated to the memory cell read/rewrite operations.

19. A DRAM according to claim 15, wherein each amplifier is able to alternately perform refresh operations and read/rewrite operations.

20. A DRAM according to claim 19, wherein said interrupter comprises at least one transistor for each amplifier for isolating the outputs thereof from the corresponding column and from the outputs of the other amplifier connected to the same corresponding column.

21. A method for controlling a device for reading/rewriting a memory cell of a dynamic random-access memory organized in rows and columns, including, for each column, a first and a second read/rewrite amplifier for each column, the method comprising:
   controlling the first amplifier having inputs for a given column for storing information contained in the memory cell for refreshing thereof using a control circuit and having outputs for a first pair of input/output lines;
   controlling the second amplifier having inputs for the given column for performing read/rewrite operations to the memory cell using the control circuit and having outputs for a second pair of input/output lines; and
   each controlling comprising isolating at least one of the inputs and outputs of each amplifier.

22. A method according to claim 21, further comprising holding the data stored in the memory cell in one of the amplifiers prior to a read operation so that the data is available for a refresh operation.

* * * * *